United States Patent
Dvoretzki et al.

(10) Patent No.: US 9,459,812 B2
(45) Date of Patent: Oct. 4, 2016

(54) SYSTEM AND METHOD FOR ZERO CONTENTION MEMORY BANK ACCESS IN A REORDER STAGE IN MIXED RADIX DISCRETE FOURIER TRANSFORM

(71) Applicant: Ceva D.S.P. Ltd., Herzlia Pituach (IL)

(72) Inventors: Noam Dvoretzki, Hod HaSharon (IL); Zeev Kaplan, Karmiel (IL)

(73) Assignee: Ceva D.S.P. Ltd., Herzlia Pituach (IL)

( * ) Notice: Subject to any disclaimer, the term of this patent is extended or adjusted under 35 U.S.C. 154(b) by 0 days.

(21) Appl. No.: 14/612,742

(22) Filed: Feb. 3, 2015

(65) Prior Publication Data
US 2015/0220485 A1 Aug. 6, 2015

Related U.S. Application Data

(60) Provisional application No. 61/935,132, filed on Feb. 3, 2014.

(51) Int. Cl.
G06F 12/00 (2006.01)
G06F 3/06 (2006.01)
G06F 17/14 (2006.01)

(52) U.S. Cl.
CPC ........... *G06F 3/0665* (2013.01); *G06F 3/0619* (2013.01); *G06F 3/0689* (2013.01); *G06F 17/142* (2013.01)

(58) Field of Classification Search
CPC ........... G06F 12/00; G06F 13/00; G06F 3/06
USPC ........................................ 711/100, 114, 154
See application file for complete search history.

(56) References Cited

U.S. PATENT DOCUMENTS

| | | | | |
|---|---|---|---|---|
| 4,477,878 A | * | 10/1984 | Cope | G06F 17/142 708/405 |
| 5,784,636 A | * | 7/1998 | Rupp | G06F 15/7867 712/200 |
| 6,081,821 A | * | 6/2000 | Hopkinson | G06F 17/142 708/404 |
| 7,170,849 B1 | * | 1/2007 | Arivoli | H03M 13/2707 370/208 |
| 8,364,736 B2 | | 1/2013 | Lee et al. | |
| 8,549,059 B2 | | 10/2013 | Modlin et al. | |
| 8,959,133 B2 | * | 2/2015 | Sun | G06F 17/142 708/408 |

FOREIGN PATENT DOCUMENTS

| | | |
|---|---|---|
| KR | 2012/0100197 | 9/2012 |
| TW | 2010/17529 | 5/2010 |
| WO | WO 2013/097236 | 7/2013 |

* cited by examiner

*Primary Examiner* — Tuan Thai
(74) *Attorney, Agent, or Firm* — Pearl Cohen Zedek Latzer Baratz LLP

(57) ABSTRACT

Device and method for writing Discrete Fourier transform (DFT) samples in a memory in a reorder stage, the memory includes memory banks, each having a dedicated address generator. The method includes: dividing the DFT samples into R(reorder) equally sized segments, where R(reorder) is the radix value of the reorder stage of the DFT; checking whether a number of butterfly computations per cycle of a reorder stage of the DFT operation times R(reorder), denoted as P, is not larger than the number of segments; if P is larger than the number of segments: further dividing the segments or sub-segments into X equally sized sub-segments, where X is a radix value of a next stage of the DFT operation until P is not larger than the number of sub-segments; and mapping the sub-segments to the memory, each in a separate row, with an offset that includes segment offset and sub-segment offset.

20 Claims, 10 Drawing Sheets

| i | n[i] | = | Radix 3 r(0)*A(0) + {0,1,2}*12 + | | Radix 3 r(1)*A(1) + {0,1,2}*4 + | | Radix 4 r(2)*A(2) {0,1,2,3}*1 | i | n[i] | = | Radix 3 r(0)*A(0) + {0,1,2}*12+ | | Radix 3 r(1)*A(1) + {0,1,2}*4 + | | Radix 4 r(2)*A(2) {0,1,2,3}*1 |
|---|---|---|---|---|---|---|---|---|---|---|---|---|---|---|---|
| 0 | 0 | = | 0 | + | 0 | + | 0 | 18 | 2 | = | 0 | + | 0 | + | 2 |
| 1 | 12 | = | 12 | + | 0 | + | 0 | 19 | 14 | = | 12 | + | 0 | + | 2 |
| 2 | 24 | = | 24 | + | 0 | + | 0 | 20 | 26 | = | 24 | + | 0 | + | 2 |
| 3 | 4 | = | 0 | + | 4 | + | 0 | 21 | 6 | = | 0 | + | 4 | + | 2 |
| 4 | 16 | = | 12 | + | 4 | + | 0 | 22 | 18 | = | 12 | + | 4 | + | 2 |
| 5 | 28 | = | 24 | + | 4 | + | 0 | 23 | 30 | = | 24 | + | 4 | + | 2 |
| 6 | 8 | = | 0 | + | 8 | + | 0 | 24 | 10 | = | 0 | + | 8 | + | 2 |
| 7 | 20 | = | 12 | + | 8 | + | 0 | 25 | 22 | = | 12 | + | 8 | + | 2 |
| 8 | 32 | = | 24 | + | 8 | + | 0 | 26 | 34 | = | 24 | + | 8 | + | 2 |
| 9 | 1 | = | 0 | + | 0 | + | 1 | 27 | 3 | = | 0 | + | 0 | + | 3 |
| 10 | 13 | = | 12 | + | 0 | + | 1 | 28 | 15 | = | 12 | + | 0 | + | 3 |
| 11 | 25 | = | 24 | + | 0 | + | 1 | 29 | 27 | = | 24 | + | 0 | + | 3 |
| 12 | 5 | = | 0 | + | 4 | + | 1 | 30 | 7 | = | 0 | + | 4 | + | 3 |
| 13 | 17 | = | 12 | + | 4 | + | 1 | 31 | 19 | = | 12 | + | 4 | + | 3 |
| 14 | 29 | = | 24 | + | 4 | + | 1 | 32 | 31 | = | 24 | + | 4 | + | 3 |
| 15 | 9 | = | 0 | + | 8 | + | 1 | 33 | 11 | = | 0 | + | 8 | + | 3 |
| 16 | 21 | = | 12 | + | 8 | + | 1 | 34 | 23 | = | 12 | + | 8 | + | 3 |
| 17 | 33 | = | 24 | + | 8 | + | 1 | 35 | 35 | = | 24 | + | 8 | + | 3 |

Fig. 2

PRIOR ART

120A/B

121A/B

|  | Bank0 | Bank1 | Bank2 | Bank3 | Bank4 | Bank5 | Bank6 | Bank7 |
|---|---|---|---|---|---|---|---|---|
| Row 0 | 0 | 1 | 2 | 3 | 4 | 5 | 6 | 7 |
| Row 1 | 8 | 9 | 10 | 11 | 12 | 13 | 14 | 15 |
|  | 16 | 17 | 18 | 19 | 20 | 21 | 22 | 23 |
|  | 24 | 25 | 26 | 27 | 28 | 29 | 30 | 31 |
|  | 32 | 33 | 34 | 35 |  |  |  |  |
|  |  |  |  |  |  |  |  |  |
|  |  |  |  |  |  |  |  |  |
|  |  |  |  |  |  |  |  |  |

Fig. 3

PRIOR ART

120A

| | Bank0 | Bank1 | Bank2 | Bank3 | Bank4 | Bank5 | Bank6 | Bank7 |
|---|---|---|---|---|---|---|---|---|
| Row 0 | 0 | 1 | 2 | 3 | 4 | 5 | 6 | 7 |
| | 8 | 9 | 10 | 11 | | | | |
| ... | | | | | | | | |
| Row 64 | 12 | 13 | 14 | 15 | 16 | 17 | 18 | 19 |
| | 20 | 21 | 22 | 23 | | | | |
| ... | | | | | | | | |
| Row 128 | 24 | 25 | 26 | 27 | 28 | 29 | 30 | 31 |
| | 32 | 33 | 34 | 35 | | | | |
| ... | | | | | | | | |

|        | Bank0  | Bank1  | Bank2  | Bank3  | Bank4  | Bank5  | Bank6  | Bank7  |
|--------|--------|--------|--------|--------|--------|--------|--------|--------|
| Row 0  | 0      | 1      | 2      | 3      | 4      | 5      | 6      | 7      |
| ...    |        |        |        |        |        |        |        |        |
| Row 16 | OFFSET | 128    | 129    | 130    | 131    | 132    | 133    | 134    |
| ...    |        |        |        |        |        |        |        |        |
| Row 32 | OFFSET | OFFSET | 256    | 257    | 258    | 259    | 260    | 261    |
| ...    |        |        |        |        |        |        |        |        |
| Row 48 | OFFSET | OFFSET | OFFSET | 384    | 385    | 386    | 387    | 388    |
| ...    |        |        |        |        |        |        |        |        |
| Row 64 | OFFSET | OFFSET | 512    | 513    | 514    | 515    | 516    | 517    |
| ...    |        |        |        |        |        |        |        |        |
| Row 80 | OFFSET | OFFSET | OFFSET | 640    | 641    | 642    | 643    | 644    |
| ...    |        |        |        |        |        |        |        |        |
| Row 96 | OFFSET | OFFSET | OFFSET | OFFSET | 768    | 769    | 770    | 771    |
| ...    |        |        |        |        |        |        |        |        |
| Row 112| OFFSET | OFFSET | OFFSET | OFFSET | OFFSET | 896    | 897    | 898    |
| ...    |        |        |        |        |        |        |        |        |
| Row 128| OFFSET | OFFSET | OFFSET | OFFSET | 1024   | 1025   | 1026   | 1027   |
| ...    |        |        |        |        |        |        |        |        |
| Row 144| OFFSET | OFFSET | OFFSET | OFFSET | OFFSET | 1152   | 1153   | 1154   |
| ...    |        |        |        |        |        |        |        |        |
| Row 160| OFFSET | OFFSET | OFFSET | OFFSET | OFFSET | OFFSET | 1280   | 1281   |
| ...    |        |        |        |        |        |        |        |        |
| Row 176| OFFSET | OFFSET | OFFSET | OFFSET | OFFSET | OFFSET | OFFSET | 1408   |
| ...    |        |        |        |        |        |        |        |        |
| Row 192| OFFSET | OFFSET | OFFSET | OFFSET | OFFSET | OFFSET | 1536   | 1537   |
| ...    |        |        |        |        |        |        |        |        |
| Row 208| OFFSET | OFFSET | OFFSET | OFFSET | OFFSET | OFFSET | OFFSET | 1664   |
| ...    |        |        |        |        |        |        |        |        |
| Row 224| OFFSET | OFFSET | OFFSET | OFFSET | OFFSET | OFFSET | OFFSET | OFFSET |
| ...    | 1792   | 1793   | 1794   | 1795   | 1796   | 1797   | 1798   | 1799   |
| Row 240| OFFSET | OFFSET | OFFSET | OFFSET | OFFSET | OFFSET | OFFSET | OFFSET |
| ...    | OFFSET | 1920   | 1921   | 1922   | 1923   | 1924   | 1925   | 1926   |

Fig. 9

SYSTEM AND METHOD FOR ZERO CONTENTION MEMORY BANK ACCESS IN A REORDER STAGE IN MIXED RADIX DISCRETE FOURIER TRANSFORM

CROSS-REFERENCE TO RELATED APPLICATION

This application is a non-provisional patent application claiming the benefit of U.S. provisional patent application Ser. No. 61/935,132 filed on Feb. 3, 2014 incorporated herein by reference in its entirety.

FIELD OF THE INVENTION

The present invention relates generally to the field of computer architecture, and more particularly to memory access architecture implementing discrete Fourier transforms.

BACKGROUND

Discrete Fourier transform (DFT) or Fast Fourier transform (FFT) are often implemented in hardware by factoring large sample series processing into a series of processing stages. In each stage shorter length sample series are processed using corresponding sized FFT modules, also referred to as "butterflies", "butterfly computations", or "butterfly operations" to compute the DFT or FFT in a number of stages. The length of the shorter length sample series of each stage of the decomposition is referred to as radix. A radix-x butterfly receives x input samples and produces the same number of x output samples, where each output sample is the weighted sum of the x input samples.

Implementing a DFT or FFT in a mixed and non-mixed radix configuration, both in decimation in time (DIT) and decimation in frequency (DIF) schemes, usually includes a so-called "reordering stage" or "reorder stage". In DIF, the reorder stage is carried out after the radix processing (butterflies) stages and returns the DFT results in a desired order. In DIT, the reorder stage is carried out as a first stage. In both DIT and DIF, the reorder stage requires complex addressing and out of order memory access.

SUMMARY OF THE INVENTION

According to embodiments of the present invention, there is provided a method for writing Discrete Fourier transform (DFT) samples into memory by a logic circuit in a reorder stage of a DFT operation, the memory being arranged as an array, wherein each column of the array may be a memory bank, and wherein each memory bank has a dedicated address generator, the method may include: dividing the DFT samples into segments, based on R(reorder), where R(reorder) is a radix value of a reorder stage of the DFT operation; mapping the segments to the memory, wherein each segment may be mapped with a segment offset with reference to the first memory bank, to decrease bank contentions, wherein the segment offset may be based on a number of butterfly computations per cycle of the reorder stage of the DFT operation; and writing the DFT samples into the memory based on the mapping.

Furthermore, according to embodiments of the present invention, dividing the DFT samples into segments may include dividing the DFT samples into R(reorder) equally sized segments.

Furthermore, according to embodiments of the present invention, the method may include checking whether a number of butterfly computations per cycle of a reorder stage of the DFT operation times R(reorder), denoted as P, is not larger than the number of segments; and if P is larger than the number of segments then further dividing the segments into sub-segments and mapping the sub-segments to the memory with a sub-segment offset with reference to the segment offset, to further decrease bank contentions.

Furthermore, according to embodiments of the present invention, further dividing may include: dividing the segments into next-radix-value equally sized sub-segments until P is not larger than the number of segments.

Furthermore, according to embodiments of the present invention, the method may include providing the mapping to the dedicated address generators, wherein writing the DFT samples into the memory is performed using the dedicated address generators.

According to embodiments of the present invention, there is provided a method for writing Discrete Fourier transform (DFT) samples in a memory by a logic circuit in a reorder stage of a DFT operation, the memory being arranged as an array, wherein each column of the array may be a memory bank, and wherein each memory bank has a dedicated address generator, the method may include: dividing the DFT samples into R(reorder) equally sized segments, where R(reorder) is the radix value of the reorder stage of the DFT; checking whether a number of butterfly computations per cycle of a reorder stage of the DFT operation times R(reorder), denoted as P, is not larger than the number of segments; if P is not larger than the number of segments, then mapping the segments to the memory, with a segment offset with reference to the first memory bank; and if P is larger than the number of segments then: further dividing the current segments or sub-segments into X equally sized sub-segments, where X is a radix value of a next stage of the DFT operation until P is not larger than the number of sub-segments; and mapping the sub-segments to the memory, with a sub-segment offset in addition to the segment offset of the corresponding segment.

Furthermore, according to embodiments of the present invention, the segment offset may equal the segment number starting from 0, times the number of butterfly computations per cycle of the reorder stage of the DFT operation and the sub-segment offset may be incremental.

Furthermore, according to embodiments of the present invention, each of the segments and sub-segments may be mapped to a separate row.

Furthermore, according to embodiments of the present invention, the method may include writing the DFT samples into the memory based on the mapping, for using the dedicated address generators.

Furthermore, according to embodiments of the present invention, the reorder stage may be a first stage or a last stage of the DFT operation.

According to embodiments of the present invention, there is provided an integrated circuit for calculating Discrete Fourier transform (DFT), the chip may include a memory arranged as an array, wherein each column of the array may be a memory bank; dedicated address generators, each associated with one of the memory banks; and a logic circuit configured to: divide the DFT samples into R(reorder) equally sized segments, where R(reorder) is the radix value of the reorder stage of the DFT; check whether a number of butterfly computations per cycle of a reorder stage of the DFT operation times R(reorder), denoted as P, is not larger than the number of segments; if P is not larger than the number of segments, then map the segments to the memory, with a segment offset with reference to the first memory bank; and if P is larger than the number of segments then: further divide the current segments or sub-segments into X equally sized sub-segments, where X is a radix value of a next stage of the DFT operation until P is not larger than the number of sub-segments; and map the sub-segments to the memory, with a sub-segment offset in addition to the segment offset of the corresponding segment.

Furthermore, according to embodiments of the present invention, the logic circuit may be configured to provide the mapping of the DFT samples to the dedicated address generators, and wherein the dedicated address generators may be configured to write the DFT samples into the memory according to the mapping.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

FIG. 2 depicts sample indexes for the reorder stage for a 36-point DFT example;

FIG. 3 is a memory map illustrating a natural order of samples in memory;

FIG. 5 is a memory map illustrating a second intermediate step of the mapping of samples of the 36-point DFT example to the memory, according to embodiments of the present invention;

FIG. 8 is a memory map illustrating a the fifth and last step of the mapping of samples of the 36-point DFT example to the memory, according to embodiments of the present invention;

FIG. 9 is a memory map illustrating mapping of samples of a 2k DFT example to the memory at the reorder stage, according to embodiments of the present invention.

Figure 1:
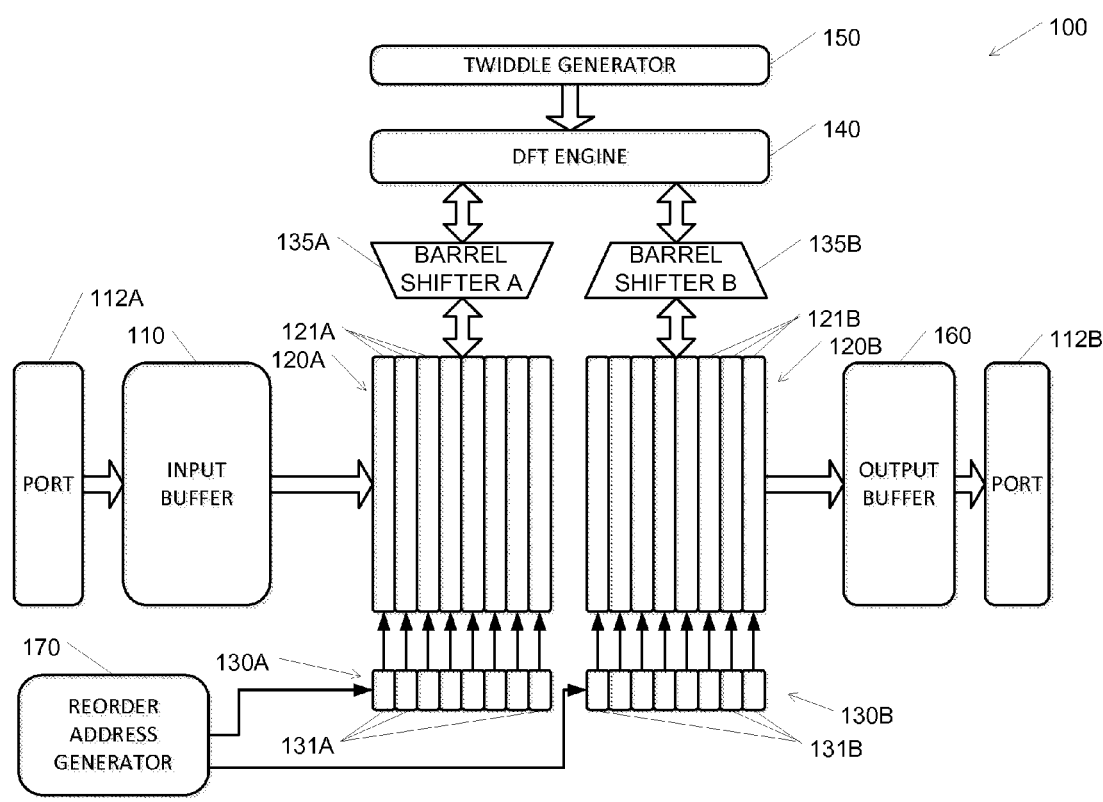
FIG. 1 is an exemplary architecture on which embodiments of the present invention may be implemented, according to embodiments of the present invention.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION

In the following description, various aspects of the present invention will be described. For purposes of explanation, specific configurations and details are set forth in order to provide a thorough understanding of the present invention. However, it will also be apparent to one skilled in the art that the present invention may be practiced without the specific details presented herein. Furthermore, well known features may be omitted or simplified in order not to obscure the present invention.

Unless specifically stated otherwise, as apparent from the following discussions, it is appreciated that throughout the specification discussions utilizing terms such as "processing," "computing," "calculating," "determining," or the like, refer to the action and/or processes of a computer or computing system, or similar electronic computing device, that manipulates and/or transforms data represented as physical, such as electronic, quantities within the computing system's registers and/or memories into other data similarly represented as physical quantities within the computing system's memories, registers or other such information storage, transmission or display devices.

Embodiments of the present invention provide a generic algorithm for calculating the data mapping to memory to reduce contentions or even ensure contention free access to memory at the reorder stage of the DFT. Embodiments of the present invention may assume a computer architecture that contains multiple address generators (one per memory bank) enabling independent access to each memory bank. As used herein the term DFT includes also FFT.

FIG. 1 is an exemplary architecture by which embodiments of the present invention may be implemented, according to embodiments of the present invention. Each one of the blocks in FIG. 1, e.g., memories 120A and 120B, address generators 130A and 130B, reorder address generator 170, DFT engine 140, etc., may be logic circuits and memories, configured to perform the operations described herein. The division into functional blocks is made for clarity of explanation. In practice, all or some of these blocks may reside in a single chip. In other embodiments other arrangements of components and functional blocks and other components and functional blocks may be used.

System 100 may include input buffer 110, output buffer 160 and memories 120A and 120B. Each of memories 120A and 120B may be seen, arranged or organized as an array and divided or separated into memory banks 121A and 121B, respectively. Each of memory banks 121A and 121B may represent a column of the array, and may have a dedicated independent address generator 131A, 131B within address generators 130A, 130B. Thus, each of memory banks 121A and 121B may be independently addressable, e.g., in each read or write cycle, data, e.g, a single DFT sample, may be read or written into different and uncorrelated addresses within any of memory banks 121A and 121B. Cells with the same address in each of memory banks 121A and 121B may be referred to herein as a row in the array. System 100 may include more than two memories. The width of memory banks 121A and 121B (e.g., the number of bits in each memory cell of memory banks 121A and 121B) may be equal to the DFT sample width with additional bits to enable storing carry bits that are a result of sum or other operations in DFT engine 140. The depth of memory banks 121A and 121B (e.g., the number of cells in each of memory banks 121A and 121B) may be larger than the number of DFT samples, allowing mapping of DFT samples as disclosed herein. Memories 120A and 120B may be internal buffers of system 100.

During normal flow of DFT calculations, DFT samples may be written into memory 120A from input buffer 110, for example, by address generator 130A, according to mapping derived by reorder address generator 170. The samples may be read into DFT engine 140 for the first stage of the DFT processing. The intermediate results of the first stage of the DFT calculation may be written into memory 120B. In a second stage of the DFT calculations the intermediate results of the first stage may be read into DFT engine 140 for processing, and the intermediate results of the second stage of the DFT calculation may be written into memory 120A, and so on until the calculation is completed. After the DFT calculation is completed, final results are written into output buffer 160. Communicating into input buffer 110 and out of output buffer 160 may be performed via ports 112A and 112B. Dedicated address generators 131A and 131B may generate addresses for reading and writing samples from/to memory banks 121A and 121B, respectively, which may enable independent access to each of memory banks 121A and 121B of memories 120A and 120B. Barrel shifters 135A and 135B may be used for alignment of the samples before accessing DFT engine 140.

DFT engine 140 may include a plurality of multiply-accumulate units and/or other hardware and logic circuits designed to perform butterfly calculations, as known in the art. A butterfly calculation, computation or operation may refer to a smaller DFT of size x, where x is typically smaller than the size of the main DFT. In each stage of the DFT calculation, butterfly calculations may be performed by DFT engine 140, in which samples read from memory 120A or memory 120B (depending on the stage number) are multiplied by the twiddle factors provided by twiddle generator 150. DFT engine 140 may have limited processing capabilities. The number of butterfly calculations that may be performed in each cycle by DFT engine 140 may be limited by, e.g., the hardware capabilities of DFT engine 140, and thus the number of input samples that may be handled by DFT engine 140 in each phase may also be limited. As used herein, a phase may refer to one or more butterfly calculations that are performed concurrently by DFT engine 140. A phase may typically require a single clock cycle, however this is not limiting and may depend on system design. A radix-x butterfly operation receives x input samples (e.g., from memory 120A or memory 120B), and produces x output samples, where x is the radix value of the radix stage. Thus, the number of radix-x butterfly operations that may be performed concurrently in each phase may equal a quotient (the integer part of the result) of either the number of inputs of DFT engine 140 or the number of memory banks 121A, 121B, whichever is smaller, divided by the radix value of the radix stage, x. The number of radix-x butterfly operations that may be performed in each phase may be referred to herein as the speed-up (SU) factor. The number of radix-2, 3, 4, 5 butterfly operations that may be performed in each phase by a DFT engine 140 that includes 8 inputs is presented in Table 1; the data in Table 1 is an example only.

TABLE 1

Example number of butterfly operations that may be performed in each phase by a DFT engine 140 that includes 8 inputs:

| Radix value (x) | Number of butterfly operations per phase (SU factor) |
|---|---|
| 2 | 4 |
| 3 | 2 |
| 4 | 2 |
| 5 | 1 |

In DIT setting, where the reorder stage is carried out first, the naïve approach of writing or storing the input samples of the DFT in memory bank 120A would be writing these samples in consecutive order to rows of memory banks 121A. This may cause very low performance due to memory bank contentions upon read by the DFT engine 140 for the first stage of calculations. In DIF setting, where the reorder stage is carried out last, the naïve approach of writing the final results of the DFT to memory bank 120A or 120B would be writing these samples in consecutive order to rows of memory banks 121B. This may incur very low performance due to memory bank contentions upon writing by the DFT engine 140 after the last stage of calculations. Conversely, implementing a method in accordance with embodiments of the present invention may reduce contentions or even secure zero contentions in accessing memory banks 120A, 120B in the first stage for DIT or last stage for DIF. This may be achieved by studying the memory access patterns of mixed and not mixed radix DFT implemented on a system that supports independent access to memory banks 121A, 121B. FIG. 1 depicts such an example architecture.

The radix factoring or decomposition may be represented as, for example: $N = R(0) \cdot R(1) \cdot \ldots R(S-1)$, wherein N is the DFT size (number of samples) and wherein R(s) is the radix value of stage s, and wherein S Denotes the number of DFT stages.

In a DIT setting, where the reorder stage is carried out first, indexing of DFT samples may be according to for example the following formulation:

$$n[i] = r(0) \cdot A(0) + r(1) \cdot A(1) + \ldots + r(S-1) \cdot A(S-1) = \sum_{s=0}^{S-1} r(s)A(s); \quad \text{(Equation 1)}$$

Where (Equation 2)

$$r(s) = \left\lfloor \frac{i}{\prod_{k=0}^{s-1} R(k)} \right\rfloor \mod R(S);$$

$$r(s) \in \{0, 1, \ldots, R(s)-1\};$$

(Equation 3)

$$A(s) = \prod_{m=s+1}^{S-1} R(m),$$

and $$A(S-1) = 1;$$

i is the reordered sample index, i=0, 1, . . . , N−1; s=0, 1, . . . , S−1;
S is the number of DFT stages and s∈{0, 1, . . . S−1} denotes stage index.
n[i]∈{0, 1, . . . N−1}—reordered data index for sample i.

Embodiments of the present invention will now be explained and demonstrated for DIT scheme, with relation to a non-limiting example. In the example (referred to herein as the 36-point DFT example), 36 point DFT may be calculated by a DFT engine 140 that includes 8 inputs. Memory 120A includes 8 memory banks 121A, and memory 120B includes 8 memory banks 121B.

FIG. 2 presents sample indexes, n[i], for the reorder stage for the 36-point DFT example. In the 36-point DFT example n={0, 1, . . . 35}, radix decomposition is 36=3·3·4→S=3. Thus, the 36-point DFT is calculated in three stages, the first stage is radix-3, the second stage is radix-3 and the third stage is radix-4. Throughout the application the first stage would be indexed 0, the second stage would be indexed 1, the third stage would be indexed 2 and so on.

$$R(0)=3; R(1)=3; R(2)=4$$

$$r(0)=\{0,1,2\}; r(1)=\{0,1,2\}; r(2)=\{0,1,2,3\} \text{(According to Equation 2)}$$

$$s=\{0,1,2\}$$

$$A(0)=3\cdot 4=12; A(1)=4; A(2)=1 \quad \text{(According to Equation 3)}$$

The indexes n[i] are calculated according to Equation 1.

Reference is now made to FIG. 3 which is a memory map illustrating a natural order of samples in memory 120A or 120B. As can be seen in FIG. 3 the DFT samples are ordered consecutively in rows of memory banks 121A or 121B, when the first sample is stored in row 0 of bank 0 (e.g., address 0 of bank 0), the second sample is written to row 0 of bank 1 (e.g., address 0 of bank 1) and so on. The radix value of the first stage of the DFT is, R(0)=3. The number of inputs of DFT engine 140 is 8. The quotient of dividing the number of inputs of DFT engine 140 by the radix value of the first stage of the DFT (the SU factor of the first stage of the DFT) is 2. Thus, in the first stage of the DFT, 2 butterfly operations may be performed concurrently in each phase or cycle. Returning to FIG. 2 it may be seen that the indexes for the first butterfly operation are 0, 12 and 24 (marked with diagonal lines in FIG. 3), and for the second butterfly operation the indexes are 4, 16 and 28 (marked with straight lines in FIG. 3). As can be seen in FIG. 3, samples 0, 16 and 24 are all located in bank 0, and samples 4, 12 and 28 are all located in bank 4. Since in each read cycle a single sample may be read from each bank, memory contentions are created. As a result, reading the required samples would take 3 cycles and would slow down the DFT calculation.

A method according to embodiments of the present invention, implemented by, e.g., reorder address generator 170, may require inputs such as for example a system definition including the number of memory banks 121A and/or 121B in memories 120A and 120B, respectively, and processing capabilities, e.g., the number of inputs of DFT engine 140, which dictates the SU factor for each radix value, or the SU factors themselves for each radix value in terms such as: one radix-5 per cycle or two radix-4 per cycle. DFT definition including DFT size such as 2048 samples or 200 samples may also be input. It should be noted that the processing capabilities of the system are bounded by the number of memory banks 121A and 121B of memories 120A and 120B and inputs of DFT engine 140. The optimum performance being accessing all memory banks 121A or 121B each cycle with no contentions. In many applications, the number of memory banks 121A or 121B equals the number of inputs of DFT engine 140, however, embodiments of the present invention are not limited in this respect and support architectures in which the number of memory banks 121A or 121B is larger or smaller than the number of inputs of DFT engine 140.

According to embodiments of the present invention, memory contentions may be reduced or completely eliminated, for example, by dividing or separating the DFT samples into segments and sub-segments of samples, based on for example radix factoring or radix values and on the number of butterfly calculations per cycle for the radix stages, mapping the segments to the memory, and writing or storing the segments and sub-segments, with an offset with relation to the first memory bank of the respective memory 120A or 120B, in a reorder stage, wherein the offsets depend on the numbers of butterfly computations per cycle for the reorder radix stage, as disclosed herein. This principle will be now demonstrated with relation to the 36-point DFT example presented hereinabove.

An example process of separating or dividing the DFT samples into segments and sub-segments and writing or storing the DFT samples sequentially into rows of memories 120A or 120B in a reorder stage will be explained with relation to FIGS. 4-8. However, it should be readily understood that the intermediate steps and FIGS. 4-7 are described and presented as illustration aid and may not form part of some embodiments, e.g., data may be written into memories 120A or 120B according to a final mapping. However, data may be written into memories 120A or 120B according to the mapping of any intermediate step (this may reduce but not eliminate memory contentions). The examples are given with relation to DIT showing memory maps of memory 120A. However the similar procedure applies to DIF when the results of the last stage of the DFT are written to memory 120A or 120B, mutatis mutandis.

In a first intermediate step of the mapping, the DFT samples are separated or divided into R(0) equally sized segments, where R(0) is the radix value of the first stage of the DFT. Next, each segment may be mapped to a new, separate, row of memory 120A.

Figure 4:
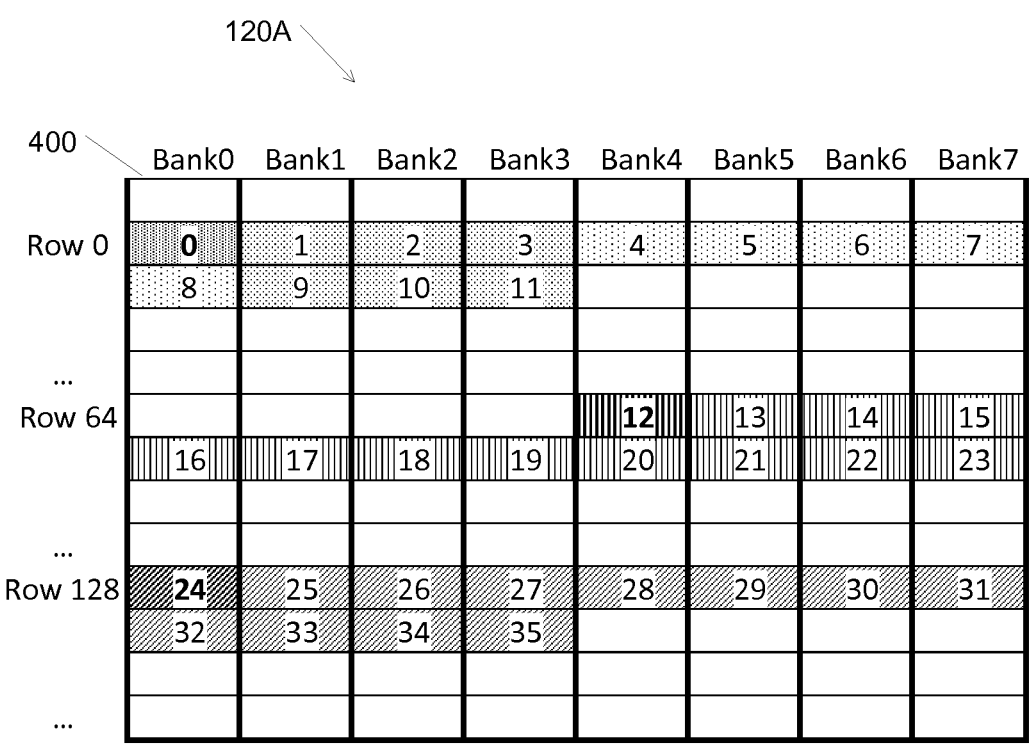
FIG. 4 is a memory map illustrating a first intermediate step of the mapping of samples of the 36-point DFT example to the memory, according to embodiments of the present invention.

Reference is now made to FIG. 4 which is a memory map illustrating the first intermediate step of the mapping of samples of the 36-point DFT example to memory 120A, according to embodiments of the present invention. The value of the first radix stage, R(0) in the 36-point DFT example is 3. Therefore, as can be seen in FIG. 4, the DFT samples are divided into 3 equally sized segments. The first segment includes samples 0-11, the second segment includes samples 12-23 and the third segment includes samples 24-35. Each segment is mapped to a separate row of memory 120A.

In a second intermediate step of the mapping, each segment may be aligned with the first memory bank or first column 400 (Bank 0) of memory 120A.

Reference is now made to FIG. 5 which is a memory map illustrating the second intermediate step of the mapping of samples of the 36-point DFT example to memory 120A, according to embodiments of the present invention. In FIG. 5 each segment is aligned with first memory bank 400 of memory 120A. Thus, the first sample of each segment, e.g., samples 0, 12 and 24, are mapped to first memory bank 400 (Bank 0).

In a third intermediate step of the mapping, each segment may be mapped to memory 120A with a segment offset with reference to first memory bank 400 of memory 120A. The segment offset may be calculated based on the segment number (starting from 0) and the SU factor of the first radix stage. For Example, the segment offset may be calculated according to the segment number (starting from 0) times the SU factor of the first radix stage. In other embodiments, other segment offsets may not be used.

Figure 6:
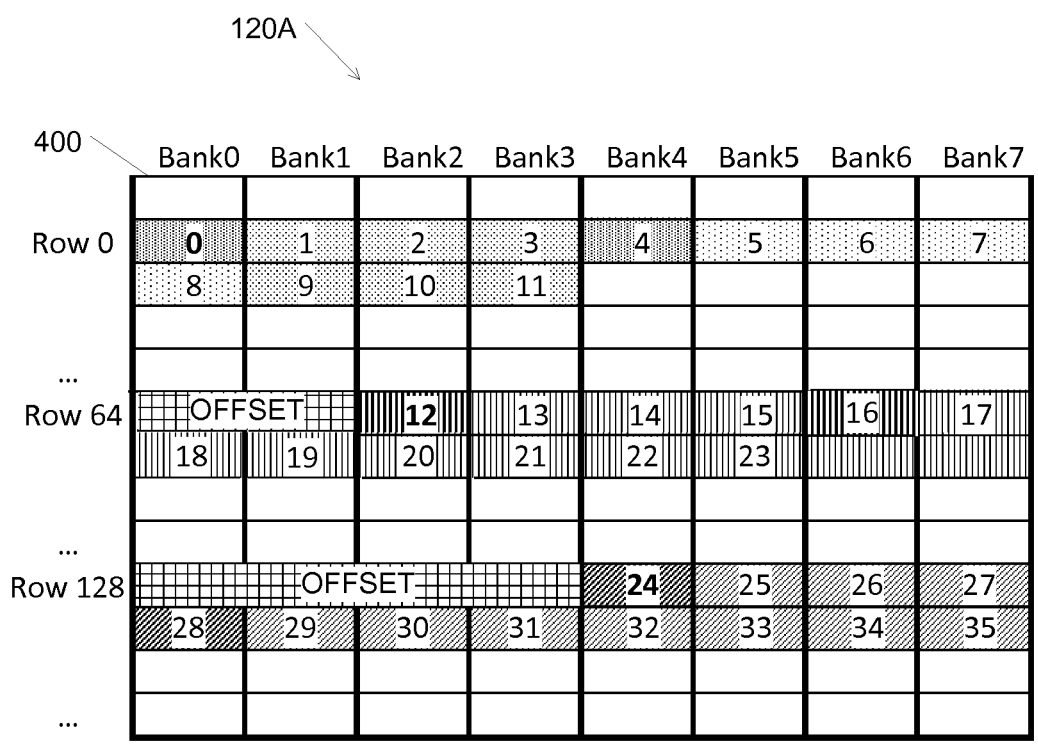
FIG. 6 is a memory map illustrating a third intermediate step of the mapping of samples of the 36-point DFT example to the memory, according to embodiments of the present invention.

Reference is now made to FIG. 6 which is a memory map illustrating the third intermediate step of the mapping of samples of the 36-point DFT example to memory 120A, according to embodiments of the present invention. In FIG. 6, each segment has an offset with reference to the first memory bank 400 of memory 120A. The SU factor for the first radix stage of the 36-point DFT example is 2. Thus, the offset of segment No. 0 is 0, the offset of segment No. 1 is 2, and the offset of segment No. 3 is 4. It can be seen in FIG. 6 that memory contention for the first butterfly operation is avoided since each of samples 0, 12 and 24 is now located in a different memory bank (Bank0, Bank2 and Bank4, respectively). However, there are still memory contentions between samples of the first butterfly operation and samples of the second butterfly operation, e.g., sample 0 of the first butterfly operation and sample 28 of the second butterfly operation are both stored in Bank 0 and cannot be read in a single cycle, and sample 4 of the first butterfly operation and sample 24 of the second butterfly operation are both stored in Bank 4 and cannot be read in a single cycle.

In a fourth intermediate step of the mapping, it may be checked whether the SU factor of the first stage of the DFT times R(0), denoted P, is not larger than (smaller than or equal to) the number of segments. If P is larger than the number of segments, each of the segments may be further split or divided into a next-radix-value sub-segments that are equally sized, until P is not larger than the total number segments or sub-segments. For example, after the first division into R(0) segments, the next-radix-value is R(1). So, if P is larger than the number of segments, each segment may be divided into R(1) sub-segments. After the second division there is a total of R(0)*R(1) sub-segments. If P is still larger than the number of sub-segments, each of the sub-segments may be further divided into a next-radix-value sub-segments, which is now R(3), and so on, until P is not larger than the total number segments or sub-segments.

Figure 7:
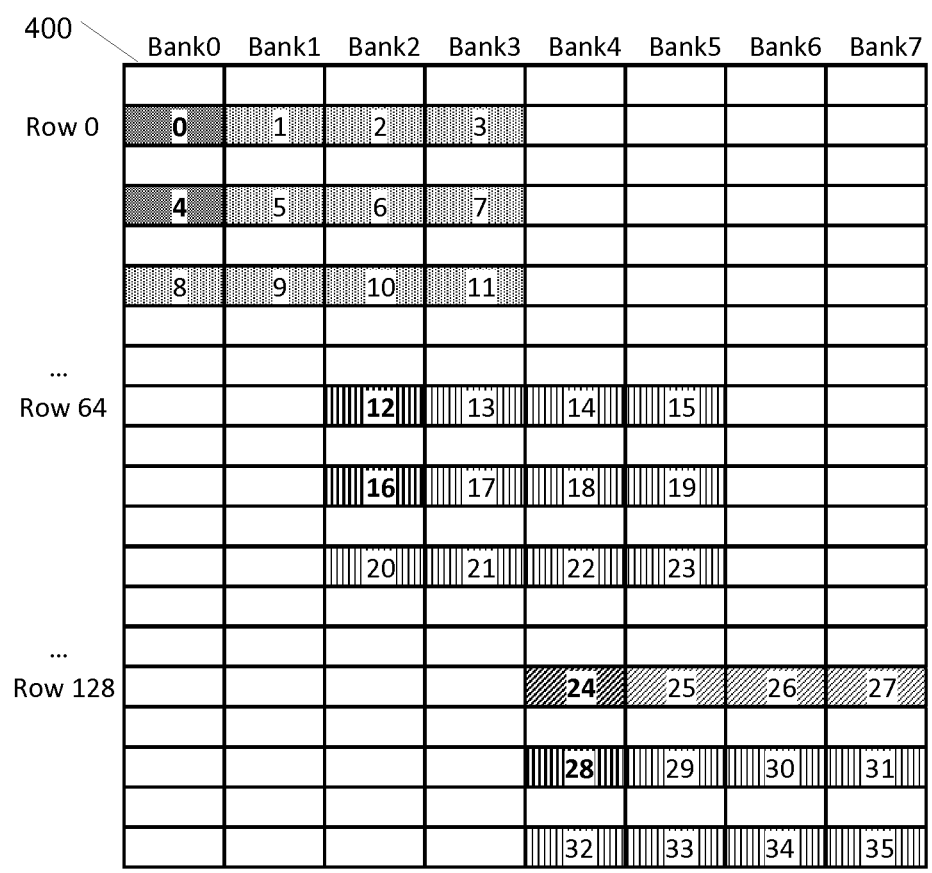
FIG. 7 is a memory map illustrating a fourth intermediate step of the mapping of samples of the 36-point DFT example to the memory, according to embodiments of the present invention.

Reference is now made to FIG. 7 which is a memory map illustrating the fourth intermediate step of the mapping of samples of the 36-point DFT example to memory 120A, according to embodiments of the present invention. The value of the second radix, R(1) in the 36-point DFT example is 3. Therefore, as can be seen in FIG. 7, each of the segments is broken into three equally sized sub-segments. The first segment, including samples 0-11 is divided to three sub-segments, including samples 0-3, 4-7 and 8-11, respectively. The second segment, including samples 12-23 is divided to three sub-segments: including samples 12-15, 16-19 and 20-23, respectively. The third segment, including samples 24-35 is divided to three sub-segments, including samples 24-27, 28-31 and 32-35, respectively. Each sub-segment is mapped to a separate row. At this point, the sub-segments of each segment are aligned with the segment offset of the respective segment. For example, each of the three sub-segments of the first segment is mapped with zero offset (the first sample of each sub-segments is mapped to Bank 0), each of the three sub-segments of the second segment is mapped with offset of 2 memory cells (the first sample of each sub-segment is mapped to Bank 2), and each of the three sub-segments of the third segment is mapped with an offset of 4 memory cells (the first sample of each sub-segment is mapped to Bank 4).

In a fifth intermediate step of the mapping, P is not larger than the total number segments or sub-segments and each segment or sub-segment may be mapped to memory 120A or 120B with a sub-segment offset with reference to the segment offset of the corresponding segment, so that:

Total offset=segment offset+sub-segment offset

The sub-segment offset may be incremental, e.g., start from 0 for the first sub-segment of each segment and increase by 1 for each sub-segment within a segment. For example, the offset of sub-segment No. 0 equals 0, the offset of sub-segment No. 1 equals 1, the offset of sub-segment No. 2 equals 2, etc. In other embodiments, the sub-blocks offset may not be incremental. It should be readily understood that in some cases segments or sub-segments may not necessarily be mapped or stored in separate rows. For example, if a total offset of a first sub-segment is larger than the number of cells required for a second sub segment in a certain row, the first sub-segment may be mapped to or stored in the same row as the second sub-segment.

DFT samples may be written into memory 120A or results may be written into memory 120A or 120B after the above described process has completed, according to the mapping. For example, reorder address generator 170 may receive as an input a system definition including the number of memory banks 121A and/or 121B in memories 120A and 120B, respectively, processing capabilities of DFT engine 140, the DFT size and radix decomposition, and may provide final mapping of DFT samples to memories 120A or 120B to dedicated address generators 131A or dedicated address generators 131B, respectively. For example, the mapping of DFT samples to memories 120A or 120B may include generating memory bank number and address within the memory bank for each DFT sample. For example, in DIT setting, reorder address generator 170 may provide mapping of DFT samples to memory 120A to address generator 130A and dedicated address generators 131A. Thus, dedicated address generators 131A may copy each DFT sample from input buffer 110 into memory bank number and address within the memory bank 121A provided by reorder address generator 170. Additionally, dedicated address generators 131A may read the DFT samples for the first stage of the DFT calculation based on the mapping provided by reorder address generator 170. After the first stage of the DFT calculation, the results are written in a desired order. In DIF setting, reorder address generator 170 may provide mapping of DFT results to memory, e.g., memory 120B, to the corresponding address generator and dedicated address generators, e.g., address generator 130B and dedicated address generators 131B. Thus, the dedicated address generators may write each result of the last radix stage into the memory bank number and address within the memory bank provided by reorder address generator 170. Additionally, the address generator may read the DFT results into output buffer 160 based on the mapping provided by reorder address generator 170.

Figure 8:
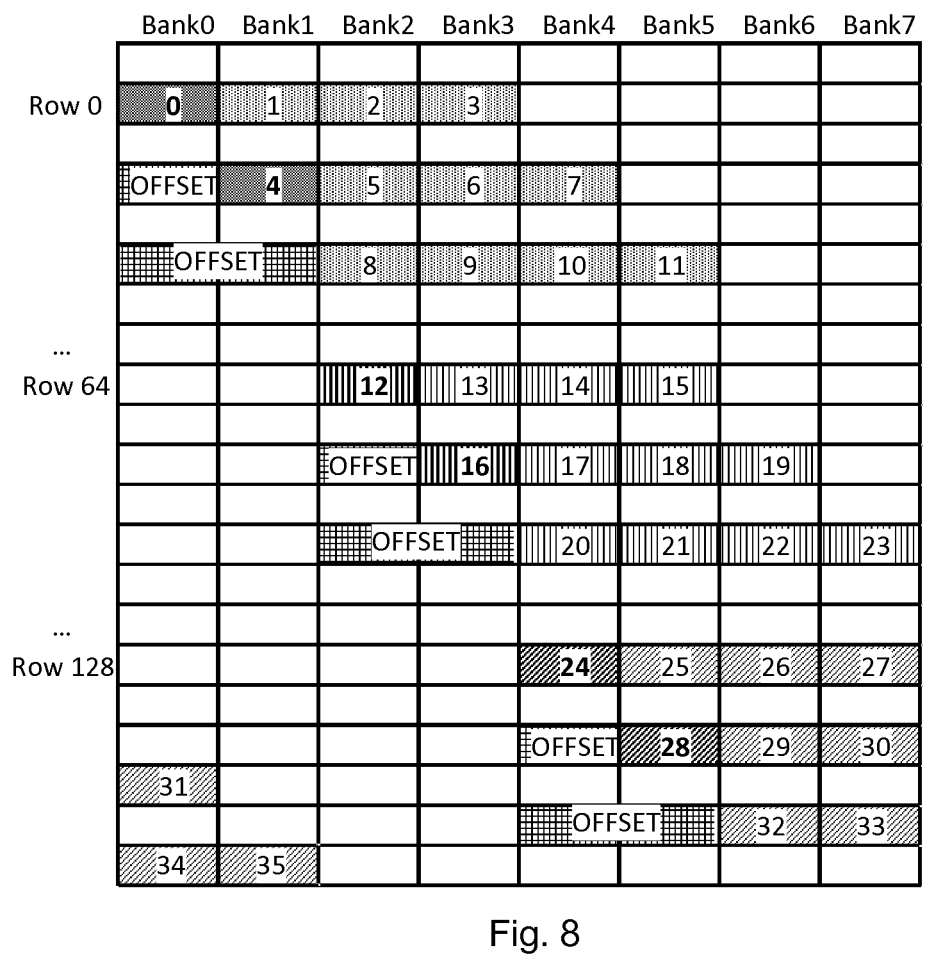

Reference is now made to FIG. 8 which is a memory map illustrating the fifth and last step of the mapping of samples of the 36-point DFT example to memory 120A, according to embodiments of the present invention. R(1) of the 36-point DFT example is 3. Hence, after the division into sub-segments there are 12 sub-segments and P is not larger than the number of segments. Therefore, each sub-segment is mapped to memory 120A with an incremental offset with reference to the segment offset of its corresponding segment. For example, for segment No. 1, the segment offset is 2 memory cells. The offset of sub-segment No. 0 of each segment equals 0 (sample 12 is mapped to Bank 2), the offset of sub-segment No. 1 of each segment equals 1 (sample 16 is mapped to Bank 3) and the offset of sub-segment No. 2 of each segment equals 2 (sample 20 is mapped to Bank 4). DFT samples may be written into memory 120A as presented in FIG. 8. It should be noted that other offsets may be given to either the segments or to sub-segments within segments. For example, in the example of FIG. 8 the third sub-segment of each segment may be given an offset of zero.

As can be seen in FIG. 8 the first six samples needed for the first two butterfly operations that are performed concurrently, e.g., samples 0, 12, 24 and 4, 16, 18, are each located in different memory bank. Thus, all six samples that are required for the first two butterfly operations that are performed concurrently may be read in a single cycle with no contentions. The same applies to samples 8, 20, 32 and 1, 13, 25 that are required for the next two butterfly operations that are performed concurrently, and to samples 5, 17, 29, 9, 21, 33 that are required for the next two butterfly operations that are performed concurrently, and so on.

It should be noted with relation to the above described embodiments of the invention that the empty rows present between segments and sub-segments in FIGS. 4-8 are not mandatory. Additionally, memory banks 121A and 121B should be designed to have sufficient depth with relation to the length of the DFT calculation or operation (the number of DFT samples for each DFT operation) to accommodate the samples as well as the free cells between segments and sub-segments. Additionally, in case a sub-segment requires more than one row (e.g., including the offset) samples are written into the next row, e.g., samples 31, 43 and 35 in FIG. 8.

Reference is now made to FIG. 9 which is a memory map illustrating mapping of samples of a 2k DFT example to the memory at the reorder stage, according to embodiments of the present invention. The 2k example is presented in DIT scheme, in which the reorder stage is the first stage. FIG. 9 presents only the first row of each sub-group. In the example (referred to herein as the 2k DFT example), 2048 point DFT may be calculated by a DFT engine that includes 8 inputs. Memory 120A includes 8 memory banks 121A, and memory 120B includes 8 memory banks 121B. In the 2k DFT example n={0, 1, . . . 2047}, radix breakdown is 2048=4·4·4·4·2·4→S=6. Thus, the 2k DFT is calculated in six stages, the first, second, third fourth and sixth stages are radix-4, and the fifth stage is radix-2.

$R(0)=4; R(1)=4; R(2)=4; R(3)=4; R(4)=2; R(5)=4$ $r(0),r(1),r(2),r(3),r(5)=\{0,1,2,3\}; r(4)=\{0,1,2\};$  (According to Equation 2)

$s=0,1,2,3,4)$ $A(0)=4\cdot2\cdot4\cdot4=128; A(1)=4\cdot2\cdot4=32; A(2)=2\cdot4=8;$ $A(3)=4; A(4)=1$  (According to Equation 3)

The indexes n[i] may be calculated according to Equation 1. The SU factor of the reorder stage of the DFT equals 2, which is the quotient of dividing the number of inputs of DFT engine 140, which is 8, by the radix value of the first stage of the DFT, which is 4. The samples of the DFT may be split or divided into 4 equally sized segments, since R(0), the radix value of the first stage of the DFT equals 4. A segment offset may be given for each segment. The segment offset may equal the segment number starting from 0, times the SU factor of the first stage of the DFT operation. In the example of FIG. 9, the segment offset equals the segment number starting from 0, times 2 which is the SU factor of the first stage of the DFT operation. Thus, the segment offset of the first segment is 0, the segment offset of the second segment is 2, the segment offset of the third segment is 4, and the segment offset of the fourth segment is 6. The SU factor of the first stage of the DFT times R(0), denoted as P, equals P=2*4=8. Thus, P is larger than the number of segments, which at this point equals R(0)=4. Therefore, Each of the segments may be split or divided into R(1)=4 sub-segments, since R(1), the radix value of the second stage of the DFT operation equals 4. Thus, the DFT samples may be split or divided into R(0)·R(1)=4·4=16 sub-segments. Thus, after the second division, P is not larger than the number of sub-segments, and it is not required to further divide each sub-segment into a next radix value sub-segments. Accordingly, the sub-segments may be mapped to the memory banks of the respective memory, e.g., memory banks 121A of memory 120A. Each of the sub-segments may be mapped to the memory banks in a separate row, with a sub-segment offset, e.g., an incremental offset, with reference to the segment offset of the corresponding segment. For example, the sub-segment offset of each first sub-segment within each segment may be 0, the sub-segment offset of each second sub-segment within each segment may be 1, the sub-segment offset of each first sub-segment within each segment may be 2, and the sub-segment offset of each third sub-segment within each segment may be 3. The total offset may equal the segment offset plus the sub-segment offset. Next, the DFT samples may be written into the memory based on the mapping, for example by dedicated address generators, e.g., dedicated address generators 131A, 131B.

The samples required for the first phase including two radix-4 butterfly operations in the 2k DFT, example are samples 2, 128, 512, 640, 1024, 1152, 1536 and 1664, all highlighted with diagonal lines in FIG. 9. It may be seen in FIG. 9 that each of the samples required for the first phase or two radix-4 butterfly operations in the 2k DFT example is mapped to a different memory bank. The same is true for the rest phases of butterfly operations of the 2k example.

Figure 10:
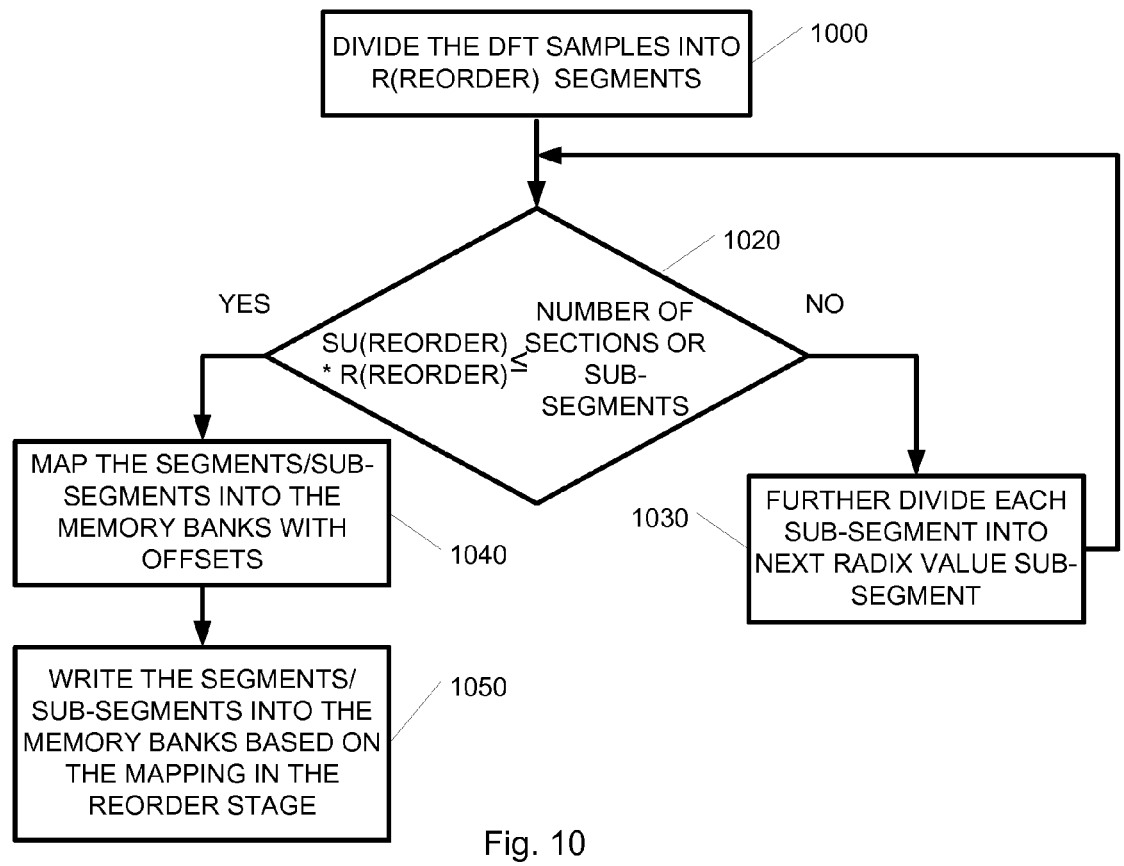
FIG. 10 is a flowchart diagram illustrating a method for mapping of DFT samples to the memory in the reorder stage in accordance with embodiments of the present invention.

Reference is now made to FIG. 10 which is a flowchart diagram illustrating a method for writing DFT samples into memory in the reorder stage, in accordance with embodiments of the present invention.

In operation 1000, the samples of the DFT may be split or divided into R(reorder) equally sized segments, where R(reorder) is the radix value of the reorder stage of the DFT. The reorder stage of the DFT may be the first stage for DIT and the last stage for DIF. Thus, R(reorder) may be R(0) for DIT and R(S−1) for DIF. In operation 1020 it may be checked whether the SU factor of the reorder stage of the DFT times R(reorder), denoted P, is not larger than (smaller than or equal to) the number of segments, which in this stage equals R(reorder). If P is larger than the number segments (that is the case the SU factor of the reorder stage of the DFT is larger than 1), then in operation 1030 each segment is further split or divided into equally sized R(next-radix-value) sub-segments (referred to herein as next-level sub-segments) and the method may return to operation 1020. R(next-radix-value) may equal the value of the next radix stage, e.g., the radix value of the following radix stage for DIT or the radix value of the previous radix stage for DIF. In DIT, after the first division, the next radix stage is the second radix, hence each segment may be split or divided into R(1) sub-segments, where R(1) is the radix value of the second stage of the DFT. Therefore, the DFT samples are split or divided into R(0)*R(1) sub-segments. In DIF after the first division, the next radix is the one before the last radix, hence each segment may be split or divided into R(S−2) sub-segments, where R(S−2) is the radix value of the one before the last stage of the DFT. Therefore, the DFT samples are split or divided into R(S−1)*R(S−2) sub-segments. In operation 1020 it is checked whether after further division P is not larger than the number of sub-segments. If P is still larger than the number of sub-segments, operation 1030 is repeated until P is not larger than the number of sub-segments. Each time operation 1030 is repeated the sub-segments are further split or divided into the next-radix-value sub-segments that are equally sized and the method returns to operation 1020. Thus, in DIT, after being split or divided into the radix value of the second stage of the DFT, sub-segments are split or divided into radix value of the third stage of the DFT, and so on. In DIF, after being split or divided into the radix value of the one before last stage of the DFT, sub-segments are split or divided into radix value of the two before last stage of the DFT, and so on.

If P is not larger than the number of sub-segments, then in operation 1040 the segments (in case the SU factor of the reorder stage of the DFT is equals 1) or sub-segments (in case the SU factor of the reorder stage of the DFT is larger than 1) are mapped to the memory banks of the respective memory, e.g., memory banks 121A of memory 120A or memory banks 121B of memory 120B. Each of the segments or sub-segments may be mapped to the memory banks of the respective memory in with an offset. The offsets may be calculated as follows. A segment offset may be given to each segment. The segment offset may be calculated based on the segment number (starting from 0) and the SU factor of the reorder stage. For Example, the segment offset may equal the segment number starting from 0, times the SU factor of the reorder stage of the DFT operation. The segments offset may be measured relatively to the first memory bank. A sub-segments offset may be given to each sub-segment. The sub-segment offset may be incremental, e.g., start from 0 and increase by 1 for each sub-segment. The sub-segment offset may be measured with reference to the segment offset of the corresponding segment. Thus, the total offset of a sub-segment equals the corresponding segment offset plus the sub-segment offset. Segments and sub-segments may be mapped each to a separate row. However, in some cases segments or sub-segments may not necessarily be mapped to separate rows. For example, if a total offset of a first sub-segment is larger than the number of cells required for a second sub segment in a certain row, the first sub-segment may be mapped to or stored in the same row as the second sub-segment. In operation 1050, the DFT samples may be written into the memory based on the mapping, for example by dedicated address generators, e.g., dedicated address generators 131A, 131B.

General formulation for the total offset (e.g., internal memory bank number starting from 0) of each sub-segment may be given by:

$$\text{Total Offset}(j) = \left\lfloor \frac{j}{R(reoeder)} \right\rfloor \cdot SU + j\%B$$

Where j is the sub-segment index starting from 0 and ranging to the number of sub-segments minus 1, B is the number of sub-segments per segment and SU is the SU factor of the reorder stage, $\lfloor \ldots \rfloor$ denotes floor operation and % denotes modulo operation (the remainder after division).

Advantageously, embodiments of the present invention may include a generic method which may be applied to any system or DFT size. Additionally, while being especially beneficial for image processing and communication systems, the aforementioned embodiments of the invention can be efficiently used in any application that requires DFT implementation.

Embodiments of the invention may be implemented on an integrated circuit (IC), for example, by constructing the reorder address generator 170 and address generators 130A and 130B, as well as the other components of FIG. 1 in an integrated chip or as a part of an chip, such as application-specific integrated circuit (ASIC), a field-programmable gate array (FPGA), a central processing unit (CPU), a digital signal processor (DSP), a microprocessor, a controller, a chip, a microchip, etc.

Embodiments of the present invention, e.g., the reorder address generator 170, the address generators 130A and 130B, as well as the other components of FIG. 1, may be implemented in a hardware description language (HDL) design, written in VHSIC hardware description language (VHDL), Verilog®, or any other hardware description language. The HDL design may be synthesized using any synthesis engine such as Synopsys® Design Compiler 2000.05 (DC00), Buildgates® available from, inter alia, Cadence Design Systems, Inc. An ASIC or other integrated circuit may be fabricated using the HDL design. The HDL design may be synthesized into a logic level representation, and then reduced to a physical device using compilation, layout and fabrication techniques, as known in the art.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

The invention claimed is:

1. A method for writing Discrete Fourier transform (DFT) samples into a memory by a logic circuit in a reorder stage of a DFT operation, the memory being arranged as an array, wherein each column of the array is a memory bank, and wherein each memory bank has a dedicated address generator, the method comprising:
 dividing the DFT samples into segments, based on R(reorder), where R(reorder) is a radix value of a reorder stage of the DFT operation;
 mapping the segments to the memory, wherein each segment is mapped with a segment offset with reference to first memory bank, to decrease bank contentions, wherein the segment offset is based on a number of butterfly computations per cycle of the reorder stage of the DFT operation; and
 writing the DFT samples into the memory based on the mapping.

2. The method of claim 1, wherein dividing the DFT samples into segments comprises dividing the DFT samples into R(reorder) equally sized segments.

3. The method of claim 2, wherein the segment offset equals a segment number starting from 0, times the number of butterfly computations per cycle of the reorder stage of the DFT operation.

4. The method of claim 3, comprising:
 checking whether a number of butterfly computations per cycle of the reorder stage of the DFT operation times R(reorder), denoted as P, is not larger than the number of segments; and
 if P is larger than the number of segments then further dividing the segments into sub-segments and mapping the sub-segments to the memory with a sub-segment offset with reference to the segment offset, to further decrease bank contentions.

5. The method of claim 4, wherein further dividing comprises:
 dividing the segments into next-radix-value equally sized sub-segments until P is not larger than the number of segments.

6. The method of claim 5, wherein the sub-segment offset is incremental.

7. The method of claim 1, comprising providing the mapping to the dedicated address generators, wherein writing the DFT samples into the memory is performed using the dedicated address generators.

8. A method for writing Discrete Fourier transform (DFT) samples in a memory by a logic circuit in a reorder stage of a DFT operation, the memory being arranged as an array, wherein each column of the array is a memory bank, and wherein each memory bank has a dedicated address generator, the method comprising:
- dividing the DFT samples into R(reorder) equally sized segments, where R(reorder) is radix value of the reorder stage of the DFT;
- checking whether a number of butterfly computations per cycle of a reorder stage of the DFT operation times R(reorder), denoted as P, is not larger than number of segments;
- if P is not larger than the number of segments, then mapping the segments to the memory, with a segment offset with reference to first memory bank; and
- if P is larger than the number of segments then:
  - further dividing the current segments or sub-segments into X equally sized sub-segments, where X is a radix value of a next stage of the DFT operation until P is not larger than the number of sub-segments; and
  - mapping the sub-segments to the memory, with a sub-segment offset in addition to the segment offset of the corresponding segment.

9. The method of claim 8, wherein the segment offset equals a segment number starting from 0 times the number of butterfly computations per cycle of the reorder stage of the DFT operation and the sub-segment offset is incremental.

10. The method of claim 8, wherein each of the segments and sub-segments is mapped to a separate row.

11. The method of claim 8, comprising:
writing the DFT samples into the memory based on the mapping.

12. The method of claim 8, wherein writing the DFT samples into the memory is performed using the dedicated address generators.

13. The method of claim 8, wherein the reorder stage is a first stage.

14. The method of claim 8, wherein each segment and sub-segment is mapped to a separate row.

15. An integrated circuit for calculating Discrete Fourier transform (DFT), the integrated circuit comprising:
- a memory arranged as an array, wherein each column of the array is a memory bank;
- dedicated address generators, each associated with one of the memory banks; and
- a logic circuit configured to:
- divide the DFT samples into R(reorder) equally sized segments, where R(reorder) is radix value of the reorder stage of the DFT;
- check whether a number of butterfly computations per cycle of a reorder stage of the DFT operation times R(reorder), denoted as P, is not larger than number of segments;
- if P is not larger than number of segments, then map the segments to the memory, with a segment offset with reference to first memory bank; and
- if P is larger than the number of segments then:
  - further divide the current segments or sub-segments into X equally sized sub-segments, where X is a radix value of a next stage of the DFT operation until P is not larger than the number of sub-segments; and
  - map the sub-segments to the memory, with a sub-segment offset in addition to the segment offset of the corresponding segment.

16. The integrated circuit of claim 15, wherein the sub-segment offset is incremental.

17. The integrated circuit of claim 15, wherein the segment offset equals a segment number starting from 0, times the number of butterfly computations per cycle of the reorder stage of the DFT operation.

18. The integrated circuit of claim 15, wherein the logic circuit is configured to provide the mapping of the DFT samples to the dedicated address generators, and wherein the dedicated address generators are configured to write the DFT samples into the memory according to the mapping.

19. The integrated circuit of claim 15, wherein each segment and sub-segment is mapped to a separate row.

20. The integrated circuit of claim 15, wherein the reorder stage is a first stage.

* * * * *